United States Patent [19]

Kwan et al.

[11] Patent Number: 4,804,130

[45] Date of Patent: Feb. 14, 1989

[54] CHIP CARRIER SEALING AND BONDING FIXTURE

[75] Inventors: Jaime T. F. Kwan, Irvine; Richard A. Robinson, Garden Grove, both of Calif.

[73] Assignee: McDonnell Douglas Corporation, Long Beach, Calif.

[21] Appl. No.: 63,473

[22] Filed: Jun. 18, 1987

[51] Int. Cl.[4] ............................................. B23K 1/00
[52] U.S. Cl. ........................................ 228/6.2; 269/903; 228/44.7
[58] Field of Search ................... 228/180.2, 6.2, 212, 228/44.3, 44.7, 180.1; 269/903; 437/209, 927

[56] References Cited

U.S. PATENT DOCUMENTS

| | | | |
|---|---|---|---|
| 3,395,439 | 8/1968 | Palesi et al. | 269/903 |
| 3,713,575 | 1/1973 | Cushman | 228/6.2 |
| 4,357,575 | 11/1982 | Uren et al. | 269/903 |
| 4,573,627 | 3/1986 | Miller et al. | 228/180.2 |
| 4,585,157 | 4/1986 | Belcher | 228/6.2 |
| 4,607,779 | 8/1986 | Burns | 228/212 |

Primary Examiner—Nicholas P. Godici
Assistant Examiner—Karen Skillman
Attorney, Agent, or Firm—Benjamin Hudson, Jr.; George W. Finch; John P. Scholl

[57] ABSTRACT

A method and apparatus is provided for sealing lids to chip carrier assemblies that increases the efficiency and reliability of batch processing operations for integrated circuit manufacturing. A mounting fixture captively locates individual chip carriers with their covers in a recessed pocket that provides accurate lid-to-carrier positioning. A tension plate having a plurality of convex-type protrusions is mounted on the fixture that covers the chip carriers and lid assemblies such that a protrusion rest upon each chip carrier and lid assembly. A cover plate having a pattern of multiple apertures covers the fixture and tension plate. The relationship of the diameter of the apertures in the cover plate to the maximum protrusion diameter in the tension plate can control the amount of tension that the convex-shaped protrusion place on the individual chip carriers and lid assemblies for the sealing process.

3 Claims, 2 Drawing Sheets 4,804,130

CHIP CARRIER SEALING AND BONDING FIXTURE

BACKGROUND OF THE INVENTION
FIELD OF THE INVENTION

This invention relates generally to methods of integrated circuit assembly and packaging techniques, and more particularly to a batch processing method and apparatus for solder sealing lids on integrated circuits. Currently, the packaging processing is the most inefficient phase of integrated circuit manufacturing. Because the packaging process can be labor intensive, the packaging costs can easily exceed the costs of the integrated circuit. Also, packaging and assembly are critical steps in the integrated circuit fabrication process which affects the yield and reliability.

The packaging may be accomplished by utilizing soldered seals which may be produced by a number of well-known methods. The package assembly and lid are placed in a mold with solder between them, such that when heated the solder free-flows around the lid to form a hermetic seal. The packaging lid assembly is held in alignment by means of spring clips or weights which force together the surfaces to be soldered.

The existing methods of sealing ceramic chip carrier assemblies are slow, bulky, and unreliable. They do not ensure lid-to-carrier orientation throughout the oven sealing process. It is difficult to provide adequate horizontal leveling of the assemblies, resulting in solder-flow buildup in one area. The solder preform can be damaged or dislodged from the lids during the lid alignment or clamping operation. But more importantly, these techniques are labor intensive which adds to the overall costs of the manufacturing process.

SUMMARY OF THE INVENTION

There is provided by this invention a method and apparatus for sealing lids to chip carrier assemblies that increases the efficiency and reliability of batch processing operations for integrated circuit manufacturing. A mounting fixture captively locates individual chip carriers with their covers in a recessed pocket that provides accurate lid-to-carrier positioning. A tension plate is mounted on the fixture that covers the chip carriers and lid assemblies. The tension plate has a plurality of convex-type protrusions to match each recessed pocket in the fixture such that the protrusions rest upon the chip carrier and lid assembly. A cover plate having a pattern of multiple apertures covers the fixture and tension plate with a fastening means. The relationship of the diameter of the apertures in the cover plate to the maximum protrusion diameter in the tension plate can control the amount of tension that the convex-shaped protrusions place on the individual chip carriers and lid assemblies for the sealing process. It is an object of this invention to provide a tensioning means that maintains individual tension on each component independently. Another object of this invention is to provide easy loading of lids and carriers, reducing labor hours and solder preform damage. A further object of this invention is to provide a relatively flat horizontal batch processing for integrated circuits, having a high yield.

BRIEF DESCRIPTION OF THE PREFERRED EMBODIMENT

Figure 1:
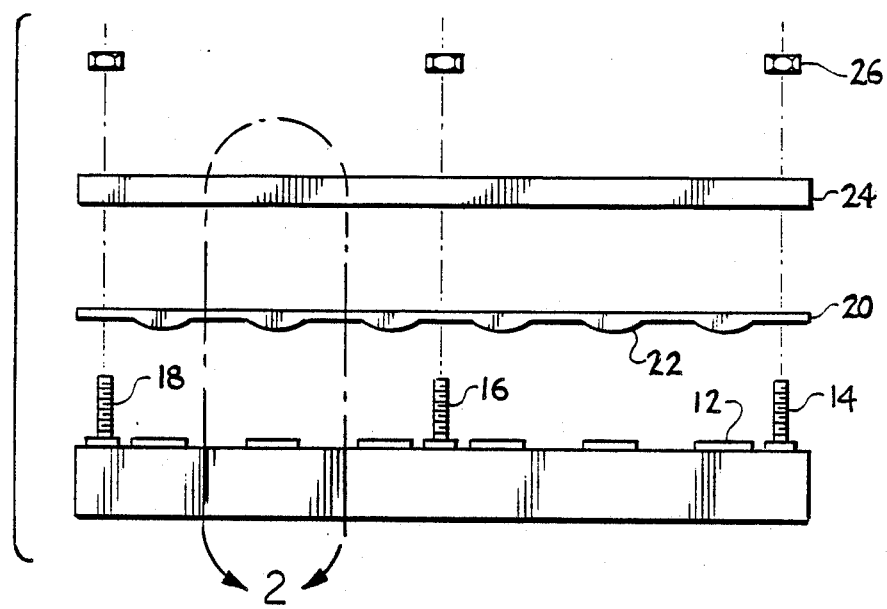
FIG. 1 illustrates an integrated circuit ceiling fixture incorporating the principles of this invention.

Referring to FIG. 1, there is shown a fixture for sealing integrated circuits incorporating the principles of this invention. The fixture is generally comprised of a boat 10 for supporting a multitude of chip carriers 12 in a manner hereinafter described. Support screws 14, 16, and 18 are mounted on the boat 10 to receive a tensioning plate 20. The tensioning plate 20 has a plurality of convex-shaped protrusions 22 such that an individual bubble is disposed to make contact with each of the multitude of chip carriers mounted in the boat 10 when the tensioning plate 20 is mounted in position over the support screws. A cover plate 24 mounts over the tensioning plate 20 and both the tensioning plate 20 and the cover plate 24 are secured to the boat 10 by means of mounting nuts such as 26. Shouldered standoffs such as 28 are connected to the mounting screws 14, 16, and 18 to accurately control the height of the tension plate 20 and the cover plate 24 to ensure consistent and repeatable forces on the chip carriers.

Figure 2:
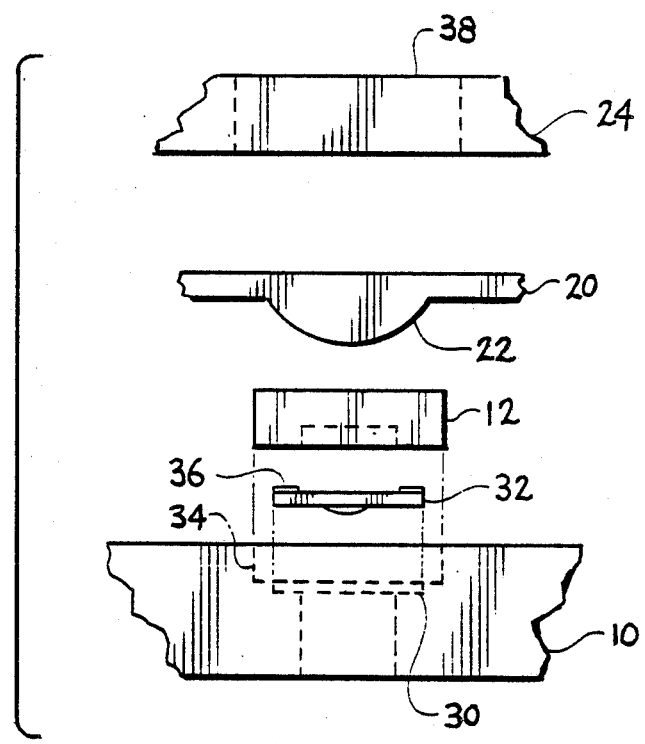
FIG. 2 illustrates a partial exploded view of the integrated circuit ceiling fixtures shown in FIG. 1.

Referring to FIG. 2, there is shown an exploded sectional view of the chip carrier assembly shown in FIG. 1. Each location for the chip carrier in the boat 10 as a first bore-type recession 30 for receiving the chip carrier lid 32 in an inverted position with the solder preforms 36 facing upwards to make contact with the chip carrier 12. The chip carrier 12 is then placed into the bore-type recession 34 such that it mounts on the lid 32 in contact with the solder preform. The recessed openings 30 and 34 serve to support and align the chip carrier lid and assembly with respect to each other. The boat may have a rectangular or square configuration for receiving a plurality of chip carriers and chip carrier lids. The tension plate 20 is configured to have a bubble such as 22 whereby a bubble on the tension plate is disposed to make contact with each of the contact carriers placed in the boat 10 when the tension plate 20 is placed upon the mounting screws of the boat 10. The cover plate 24 mounts over the tension plate 20 to supply sufficient pressure to the tension plate 20 such that the proper tension is maintained on the individual chip carriers and chip carrier lids during the manufacturing process. To facilitate uniform distribution of tension over the individual chip carriers mounted in the graphite boat 10 the cover plate 24 has apertures such as 38 that are concentric with the protrusions position over each chip carrier position. Thus, the combination of the boat 10 having the tensioning plate 20 with the multitude of protrusions 22 and the cover plate 24 having concentric openings over each bubble 22 provides a fixture for sealing integrated circuits that supplies appropriate tension for sealing the covers to the integrated circuits in batch processing that eliminates the labor required to mount individual tension devices on each chip carrier and cover.

Figure 3:
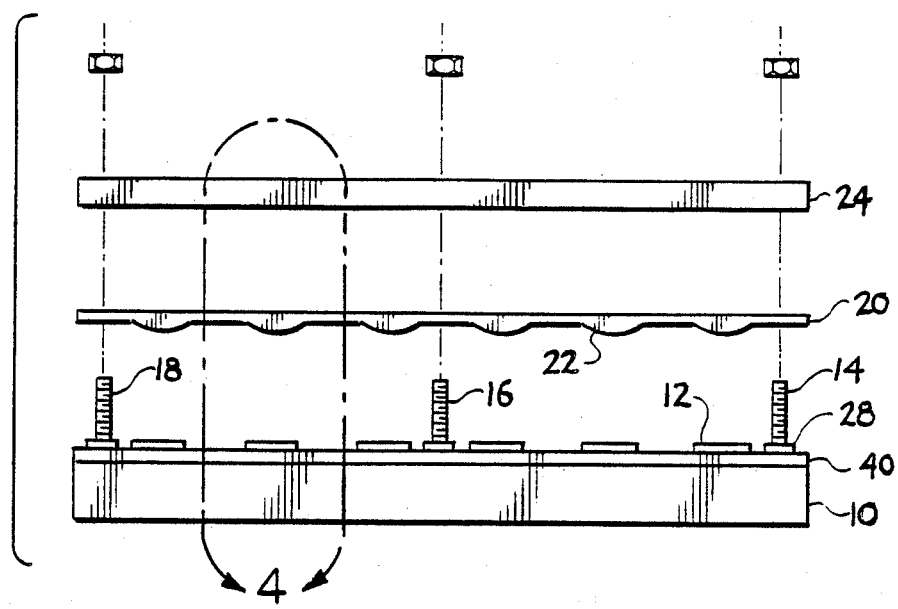
FIG. 3 an adjustable integrated circuit ceiling fixture incorporating the principles of this invention.
Figure 4:
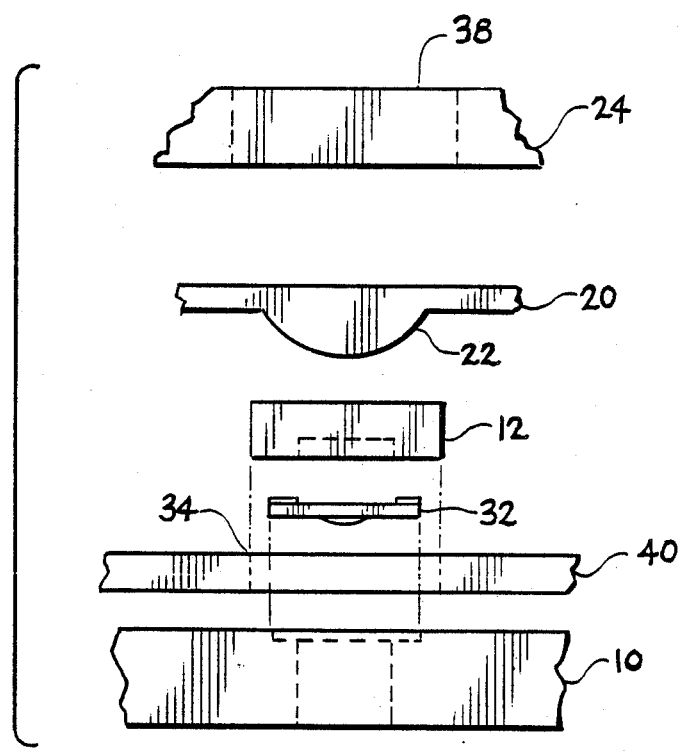
FIG. 4 illustrates a partial exploded view of the integrated circuit ceiling fixture shown in FIG. 3.

Referring to FIG. 3 and 4, there is shown a modified chip carrier fixture that incorporates the principles of this invention. The graphite boat 10 has been modified to include a chip carrier retaining plate 40 that has the recessed opening 34 for receiving the chip carrier 12.

This plate 40 may be interchanged with other plates where each of the recessed openings 34 have different sizes for accommodating various size chip carriers. Therefore, the same sealing fixture can be used for any size or type chip carrier so long as the chip carrier retaining plate 40 can be interchanged with one that has the proper recessed opening 34 for aligning and holding the chip carrier 12. Again, the standoffs 28 may be varied in height such that the tensioning applied by the tension plate 20 and the cover plate 24 is adjustable.

It can be readily seen that there is provided by this invention a novel chip carrier fixture that maintains individual tension on each component independently to provide easy loading of lids and chip carrier assemblies reducing labor hours and solder preform damage. It provides easy and accurate lid-to-carrier positioning, reducing error of component mis-registration. This fixture also lends itself to automated batch processing operations.

Although there has been illustrated and described specific detail and structure of operation, it is clearly understood that the same were merely for purposes of illustration and that changes and modifications may be readily made therein by those skilled in the art without departing from the spirit and the scope of this invention.

We claim:

1. Apparatus for assembling chip carrier packages and lids, comprising:

(a) a base configured to support a plurality of chip carrier lids in an inverted position each having a chip carrier package mounted thereon;
   (b) a tensioning plate having a plurality of protrusions disposed to be mounted on the base such that each protrusion applies pressure to each of the plurality of chip carrier packages and lids forcing them together; and
   (c) a cover plate disposed to be mounted on the tensioning plate having apertures therein concentrically positioned with respect to each protrusion on the tensioning plate land adjustable fastening means for connecting the cover plate to the base such that the tensioning plate is forced into controlled contact with the plurality of chip carrier packages and lids.

2. Apparatus for assembling chip carrier packages and lids as recited in claim 1 wherein the base is generally comprised of a first recessed opening for mounting and aligning the chip carrier lid in an inverted position and a second concentric recessed opening for mounting and aligning the chip carrier package with respect to the chip carrier lid.

3. Apparatus for assembling chip carrier packages and lids as recited in claim 2 wherein the base is further comprised of a removable mounting plate for supporting different size chip carriers and having a first recessed opening for mounting and aligning the chip carrier lid in an inverted position and a second concentric recessed opening for mounting and aligning the chip carrier package with respect to the chip carrier lid.

* * * * *